(12) United States Patent
Izumi et al.

(10) Patent No.: US 8,867,277 B2
(45) Date of Patent: Oct. 21, 2014

(54) NONVOLATILE SEMICONDUCTOR MEMORY DEVICE

(75) Inventors: Tatsuo Izumi, Tokyo (JP); Eietsu Takahashi, Yohohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 13/601,233

(22) Filed: Aug. 31, 2012

(65) Prior Publication Data

US 2013/0242666 A1 Sep. 19, 2013

(30) Foreign Application Priority Data

Jan. 31, 2012 (JP) .................. P2012-019081

(51) Int. Cl.

| | | |
|---|---|---|
| G11C 11/34 | (2006.01) | |
| G11C 16/08 | (2006.01) | |
| G11C 16/10 | (2006.01) | |
| G11C 16/12 | (2006.01) | |
| G11C 16/30 | (2006.01) | |

(52) U.S. Cl.
CPC ................ *G11C 16/12* (2013.01); *G11C 16/08* (2013.01); *G11C 16/30* (2013.01); *G11C 16/10* (2013.01)
USPC .................. 365/185.19; 365/185.18

(58) Field of Classification Search
USPC .............. 365/185.18, 185.19, 189.15, 189.16
See application file for complete search history.

(56) References Cited

U.S. PATENT DOCUMENTS

| | | | |
|---|---|---|---|
| 6,259,624 B1 * | 7/2001 | Nobukata ................. | 365/185.03 |
| 7,180,787 B2 * | 2/2007 | Hosono et al. ........... | 365/185.24 |
| 7,864,586 B2 * | 1/2011 | Tokiwa .................... | 365/185.18 |
| 7,916,545 B2 | 3/2011 | Fujiu | |
| 2011/0007572 A1 | 1/2011 | Ueno et al. | |
| 2011/0228608 A1 | 9/2011 | Shiino et al. | |
| 2011/0228610 A1 | 9/2011 | Yamada et al. | |

FOREIGN PATENT DOCUMENTS

| | | |
|---|---|---|
| JP | 2009-140542 | 6/2009 |
| JP | 2009-205728 | 9/2009 |
| JP | 2011-18397 | 1/2011 |
| JP | 2011-198419 | 10/2011 |

* cited by examiner

*Primary Examiner* — Son Dinh

(74) *Attorney, Agent, or Firm* — Oblon, Spivak, McClelland, Maier & Neustadt, L.L.P.

(57) ABSTRACT

A first non-selected word line including a word line adjacent to a selected word line is applied with a first write pass voltage. Furthermore, a second non-selected word line which is a non-selected word line excluding the first non-selected word line is applied with a second write pass voltage smaller than a program voltage. A control circuit, in the write operation, raises the first write pass voltage toward a first target value by executing a voltage raising operation having a first voltage rise width, X times, and raises the second write pass voltage toward a second target value by executing a voltage raising operation having a second voltage rise width, Y times. The first voltage rise width is larger than the second voltage rise width, and X times is fewer than Y times.

20 Claims, 11 Drawing Sheets

NONVOLATILE SEMICONDUCTOR MEMORY DEVICE

CROSS REFERENCE TO RELATED APPLICATIONS

This application is based on and claims the benefit of priority from prior Japanese Patent Application No. 2012-19081, filed on Jan. 31, 2012, the entire contents of which are incorporated herein by reference.

FIELD

Embodiments described in the present specification relate to a nonvolatile semiconductor memory device.

BACKGROUND

In recent years, as miniaturization of NAND type flash memory proceeds, reliability during a write operation of data has become a problem. NAND type flash memory includes memory cells connected in series, a source line connected to a side at one end of those memory cells connected in series, and a bit line connected to a side at the other end of those memory cells connected in series.

When writing data by this NAND type flash memory, applied voltages to the memory cells are changed in the following order. That is, a gate of a non-selected memory cell is applied with a write pass voltage Vpass (for example, about 8 V) having such a value that does not change a threshold voltage but sets the non-selected memory cell to an "ON" state. Then, a gate of a selected memory cell is applied with a program voltage Vpgm (for example, a voltage of 20 V or more) to store charges in a floating gate of the selected memory cell. As a result, the threshold voltage of the selected memory cell rises ("0" data is written to the selected memory cell). The above is a procedure for write.

DETAILED DESCRIPTION

A nonvolatile semiconductor memory device in an embodiment described below comprises: a memory cell array having memory strings arranged therein, each of the memory strings including a plurality of memory cells connected in series; a plurality of word lines connected to control gates of the memory cells; and a control circuit for controlling data write to the memory cells. The control circuit, when executing a write operation to the memory cells, applies a program voltage to a selected word line connected to a selected memory cell; applies a first write pass voltage smaller than the program voltage to a first non-selected word line including a word line adjacent to the selected word line; and applies a second write pass voltage smaller than the program voltage to a second non-selected word line which is a non-selected word line excluding the first non-selected word line. The control circuit, in the write operation, raises the first write pass voltage toward a first target value by executing a voltage raising operation having a first voltage rise width, X times, and raises the second write pass voltage toward a second target value by executing a voltage raising operation having a second voltage rise width, Y times. The first voltage rise width is larger than the second voltage rise width, and X times is fewer than Y times.

Embodiments of the present invention are described below with reference to the accompanying drawings.

First Embodiment

Figure 1:
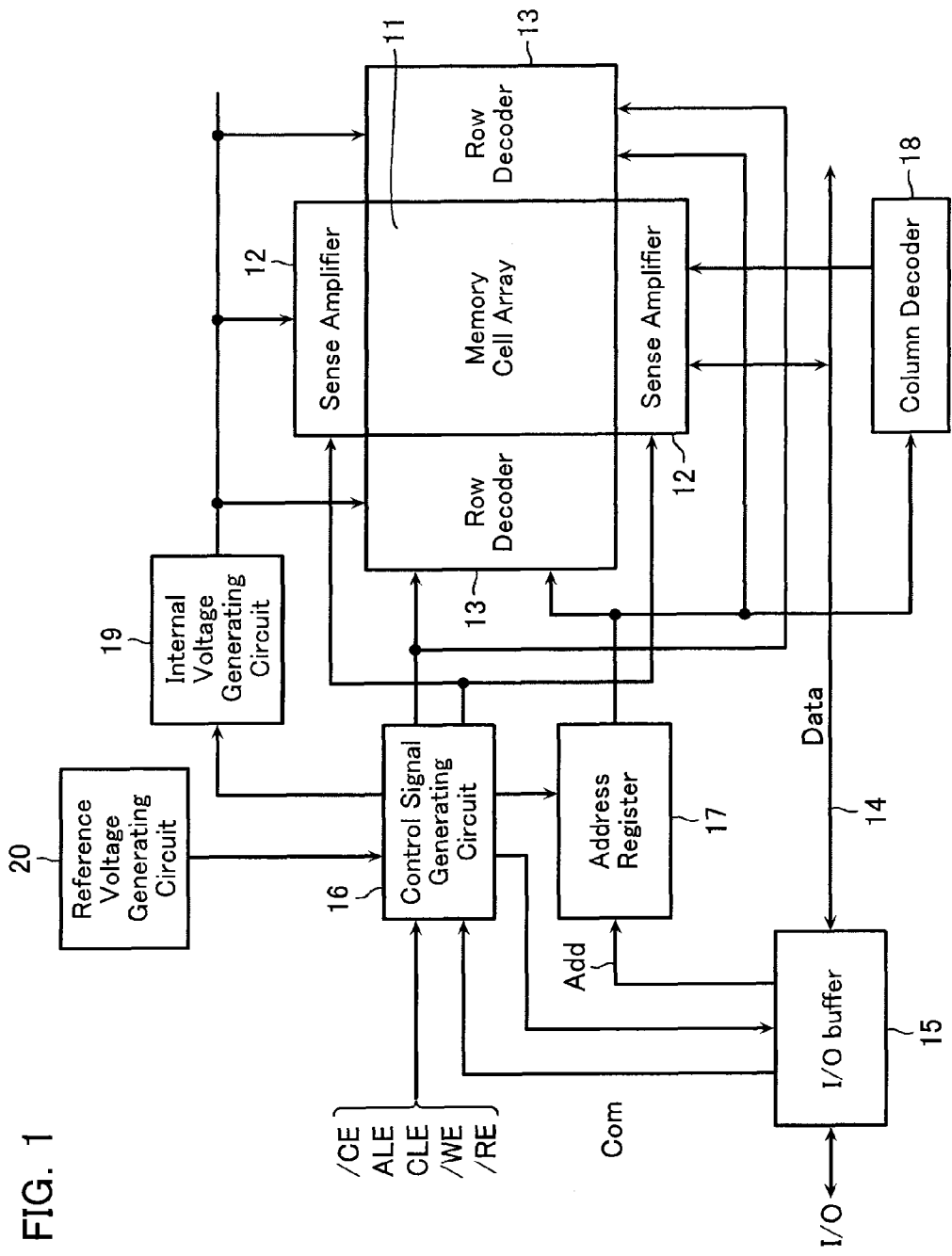
FIG. 1 is a block diagram showing a configuration of a nonvolatile semiconductor memory device (NAND type flash memory) according to a first embodiment.
Figure 2:
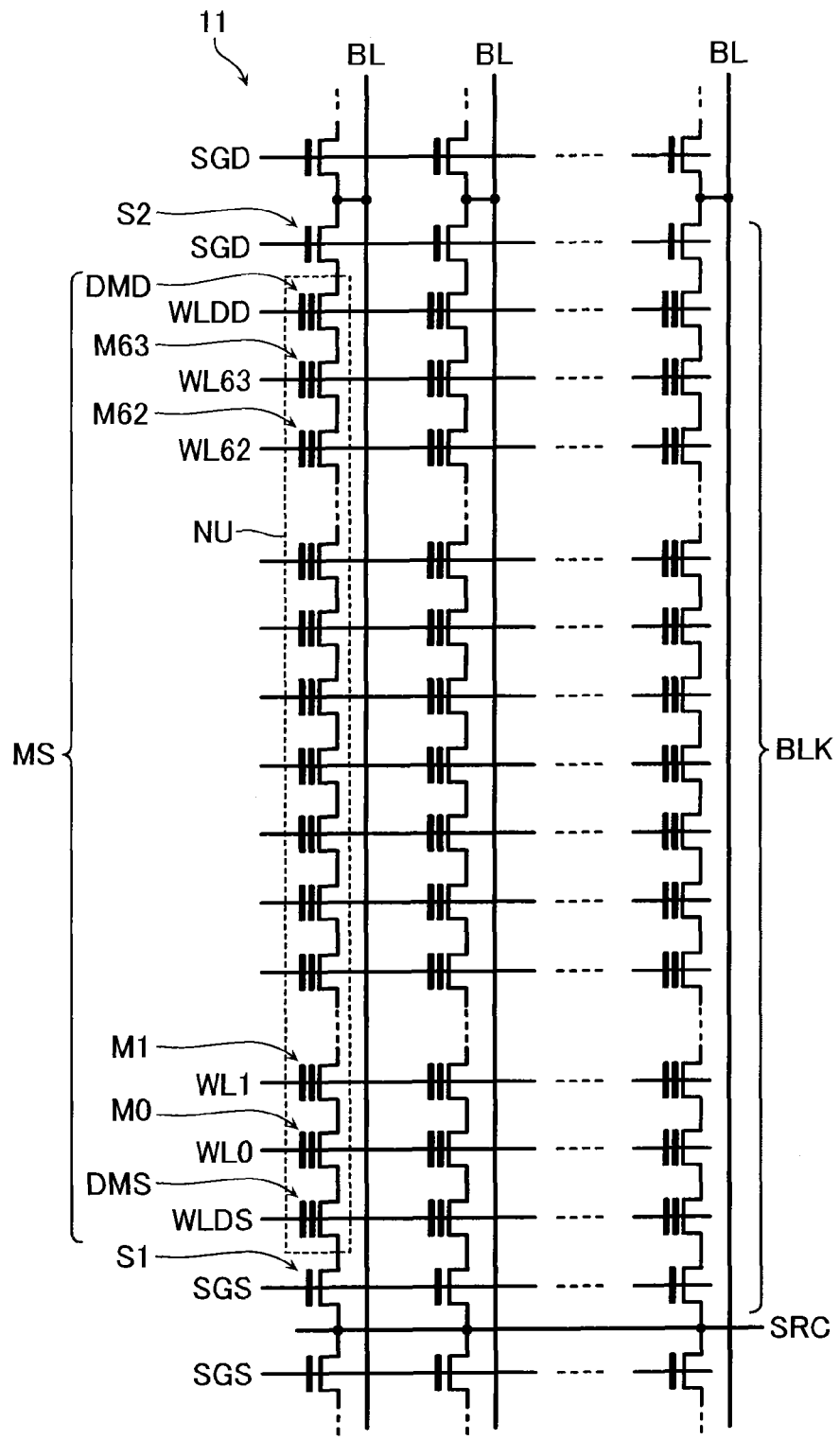
FIG. 2 is a circuit diagram showing a configuration of a memory cell array 11.

A configuration of a nonvolatile semiconductor memory device according to a first embodiment is described with reference to FIGS. 1 and 2. FIG. 1 is a block diagram showing the configuration of the nonvolatile semiconductor memory device (NAND type flash memory) according to the first embodiment. FIG. 2 is a circuit diagram showing a memory cell array 11 mentioned later.

As shown in FIG. 1, the nonvolatile semiconductor memory device according to the first embodiment includes a memory cell array 11, a sense amplifier 12, a row decoder 13, a data line 14, an I/O buffer 15, a control signal generating circuit 16, an address register 17, a column decoder 18, an internal voltage generating circuit 19, and a reference voltage generating circuit 20.

As shown in FIG. 2, the memory cell array 11 is configured having NAND cell units NU arranged in a matrix. Each NAND cell unit NU includes a memory string MS comprising for example 64 electrically rewritable nonvolatile memory cells M0-M63 connected in series and dummy memory cells DMS and DMD connected to the two ends of those series-connected memory cells M0-M63. The dummy memory cells DMS and DMD have a similar configuration to the memory cells M0-M63 but are not employed in data storage. In other words, in the present embodiment, the memory cells at the ends of the memory string MS are set as the dummy memory cells DMS and DMD, and adopt a configuration not employed for data storage.

Moreover, connected to the two ends of the memory string MS are select transistors S1 and S2 for connecting the memory string MS to a common source line SRC and a bit line BL. These memory cells M0-M63, dummy memory cells DMS and DMD, and select transistors 51 and S2 form one NAND cell unit NU.

As shown in FIG. 2, control gates of the memory cells M0-M63 in the NAND cell unit NU are connected to different word lines WL0-WL63. Control gates of the dummy memory cells DMS and DMD are connected to dummy word lines WLDS and WLDD. Moreover, gates of the select transistors S1 and S2 are connected to, respectively, select gate lines SGS and SGD.

A group of NAND cell units NU sharing one word line WL configures a block BLK which forms a unit of data erase. A plurality of blocks BLK are disposed in a bit line direction. Each bit line BL is connected to the sense amplifier 12. The memory cells commonly connected to one word line WL configure one page or a plurality of pages.

Referring again to FIG. 1, the configuration of the nonvolatile semiconductor memory device other than the memory cell array 11 is described. As shown in FIG. 1, the sense amplifier 12 is connected to the bit lines BL to perform data read in page units and serves also as a data latch for retaining one page of write data. That is, read and write are performed in page units. Attached to the sense amplifier 12 are a data cache for temporarily retaining input/output data and a column select gate circuit for performing column select.

As shown in FIG. 1, the row decoder 13 selects and drives the word lines WL and the select gate lines SGD and SGS in accordance with a row address. This row decoder 13 includes a word line driver and a select gate line driver. Moreover, the column decoder 18 for controlling the column select gate circuit in the sense amplifier 12 is provided attached to the sense amplifier 12. The row decoder 13, the column decoder 18, and the sense amplifier 12 configure a read/write circuit for performing data read and write in the memory cell array 11.

Data transfer between an external input/output port I/O and the sense amplifier 12 is performed by the input/output buffer 15 and the data line 14. That is, page data read to the sense amplifier 12 is outputted to the data line 14 to be outputted to the input/output port I/O via the input/output buffer 15. In addition, write data supplied from the input/output port I/O is loaded into the sense amplifier 12 via the input/output buffer 15.

Address data Add supplied from the input/output port I/O is supplied to the row decoder 13 and the column decoder 18 via the address register 17. Command data Com supplied from the input/output port I/O is decoded to be set in the control signal generating circuit 16.

Each of external control signals, namely, a chip enable signal /CE, an address latch enable signal ALE, a command latch enable signal CLE, a write enable signal /WE, and a read enable signal /RE, are supplied to the control signal generating circuit 16. Based on the command Com and the external control signals, the control signal generating circuit 16, in addition to performing operation control of overall operation of the memory. In addition, it controls the internal voltage generating circuit 19 to generate various kinds of internal voltages required in data read, write, and erase. In addition, the control signal generating circuit 16 is applied with a reference voltage from the reference voltage generating circuit 20. The control signal generating circuit 16 performs write from a selected memory cell M on a source line SL side and controls a read operation.

Next, a cross-sectional structure of the memory cell M, the dummy cells DMS and DMD, and the select transistors S1 and S2 are described with reference to FIGS. 3-4.

Figure 3:
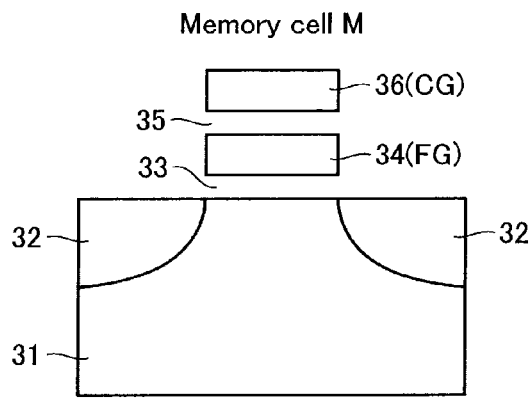
FIG. 3 is a schematic view showing a configuration of a memory cell M and dummy cells DMS and DMD.

As shown in FIG. 3, the memory cell M and the dummy cells DMS and DMD include an n-type diffusion layer 32 on a substrate 31, the n-type diffusion layer 32 functioning as a source and a drain of a MOSFET. Moreover, the memory cell M and the dummy cells DMS and DMD include a floating gate (FG) 34 on the substrate 31 via a gate insulating film 33, and a control gate (CG) 36 on the floating gate 34 via an insulating film 35.

Figure 4:
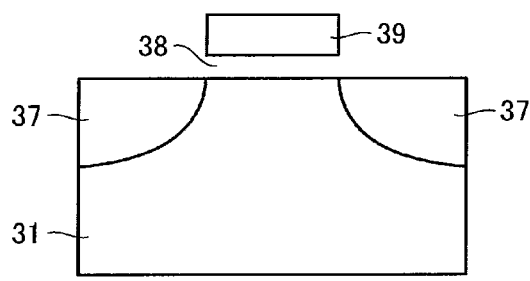
FIG. 4 is a schematic view showing a configuration of select transistors S1 and S2.

As shown in FIG. 4, the select transistors S1 and S2 include a substrate 31 and an n-type diffusion layer 37 formed in this substrate 31, the n-type diffusion layer 37 acting as a source and a drain. Moreover, the select transistors S1 and S2 include a control gate 39 on the substrate 31 via a gate insulating film 38.

Figure 5:
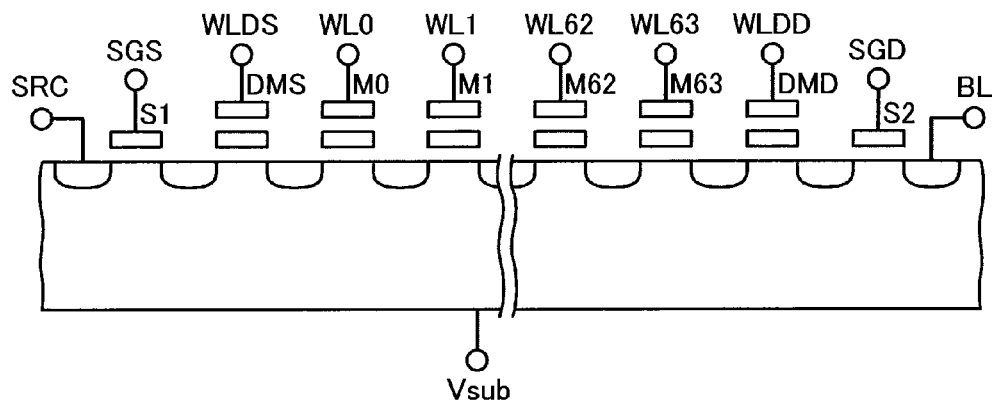
FIG. 5 is a schematic view showing a cross-sectional structure of a NAND cell unit NU.

FIG. 5 shows a cross-section of one NAND cell unit NU in the memory cell array 11. One NAND cell unit NU is configured having 64 memory cells M0-M63 and the dummy cells DMS and DMD of the configuration shown in FIG. 3 connected in series. Other ends of the dummy cells DMS and DMD are provided with the select transistors S1 and S2 of the configuration shown in FIG. 4.

Figure 6:
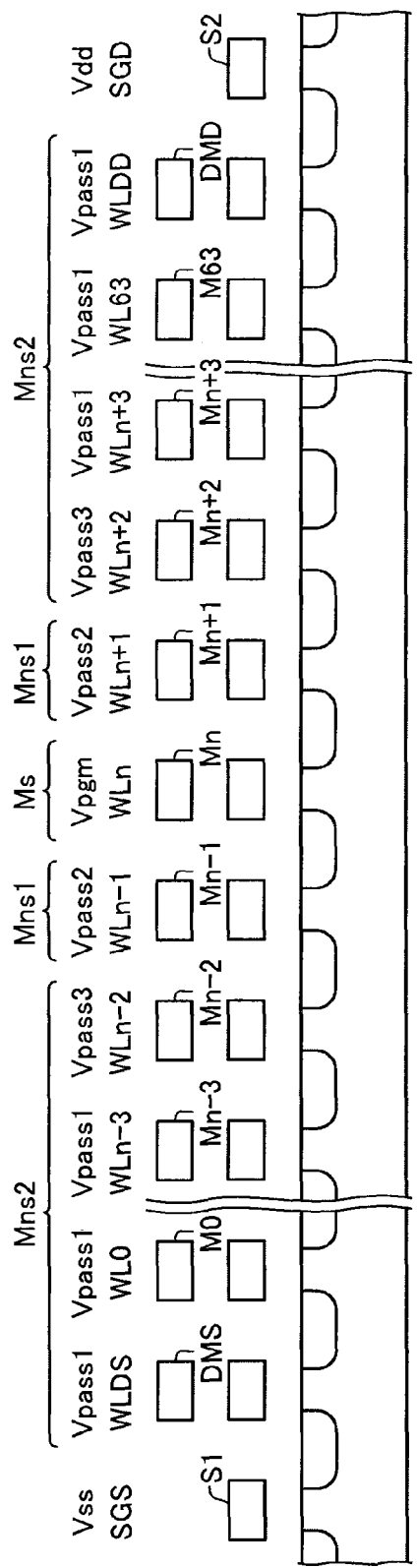
FIG. 6 is an explanatory view showing a write operation in the first embodiment.

Next, a write operation in the nonvolatile semiconductor memory device according to the first embodiment is described with reference to FIG. 6. FIG. 6 shows voltages applied to one NAND cell unit NU in the write operation of the first embodiment.

In the description below, memory cells in one NAND cell unit NU are described classified into "selected memory cell Ms", "first non-selected memory cell Mns1", or "second non-selected memory cell Mns2". A "selected memory cell Ms" means a memory cell which is subject to write. In FIG. 6, the memory cell Mn is assumed to be a selected memory cell Ms.

Moreover, a "first non-selected memory cell Mns1" includes at least memory cells adjacent to the selected memory cell Ms. In some cases, not only the memory cells adjacent to the selected memory cell Ms but also one or a plurality of non-selected memory cells adjacent to them are assumed to be a "first non-selected memory cell Mns1". In FIG. 6, only the memory cells Mn−1 and Mn+1 adjacent to the selected memory cell Mn are assumed to be a first non-selected memory cell Mns1. However, in addition to the memory cells Mn−1 and Mn+1, for example, the memory cells Mn+2 and Mn−2 adjacent to them may also be assumed to be a first non-selected memory cell Mns1.

Furthermore, a "second non-selected memory cell Mns2" means non-selected memory cells in the NAND cell unit NU excluding (the selected memory cell Ms and) the first non-selected memory cells Mns1. In FIG. 6, the memory cells M0 to Mn−2 and Mn+2 to M63, and the dummy cells DMD and DMS are assumed to be a second non-selected memory cell Mns2.

Next, voltages applied to the memory cells defined as above are described with reference to FIG. 6.

A voltage applied to the word line (selected word line WLn) of the selected memory cell Ms (memory cell Mn in FIG. 6) is set to a program voltage Vpgm. The program voltage Vpgm is a voltage of, for example, 20 V or more. As mentioned later, the program voltage Vpgm has a voltage value which rises gradually by increments of a certain step-up width as the write operation progresses.

On the other hand, the first non-selected memory cell Mns1 is applied with a write pass voltage Vpass2. The write pass voltage Vpass2 renders conductive a non-selected memory cell and is a voltage insufficient to cause write, for example, a voltage of about 8-8.5 V.

Moreover, the second non-selected memory cell Mns2 is applied with a write pass voltage Vpass3 or Vpass1 according to a position of the second non-selected memory cell Mns2. The write pass voltage Vpass3 and the write pass voltage Vpass1 render conductive a non-selected memory cell and are voltages insufficient to cause write, similarly to the write pass voltage Vpass2. However, the write pass voltage Vpass3 is a voltage larger than the write pass voltage Vpass2, for example, a voltage of about 9-10 V. The write pass voltage Vpass1 is a voltage smaller than the write pass voltage Vpass2, for example, a voltage of about 7.0-7.5 V. The write pass voltage Vpass3 is set larger compared to the write pass voltage Vpass2 in order to assist conductivity of the first non-selected memory cell Mns1 by capacitive coupling. The write pass voltage Vpass3 is applied to one or a plurality of second non-selected memory cells Mns2 adjacent to a first non-selected memory cell Mns1. The write pass voltage Vpass1 is applied to second non-selected memory cells Mns2 other than those adjacent to a first non-selected memory cell Mns1. In FIG. 6, as an example, only the memory cells Mn−2 and Mn+2 are applied with the write pass voltage Vpass3, but the present embodiment is not intended to be limited to this. For example, a way of providing voltages may also be asymmetrical regarding the selected memory cell Ms, such as having only the memory cell Mn−2 applied with the write pass voltage Vpass3.

The select gate line SGD is applied with a power supply voltage Vdd, while the select gate line SGS is applied with a ground voltage Vss. The bit line BL is provided with the power supply voltage Vdd or the ground voltage Vss according to whether data to be written to the selected memory cell Ms is "1" or "0".

Figure 7:
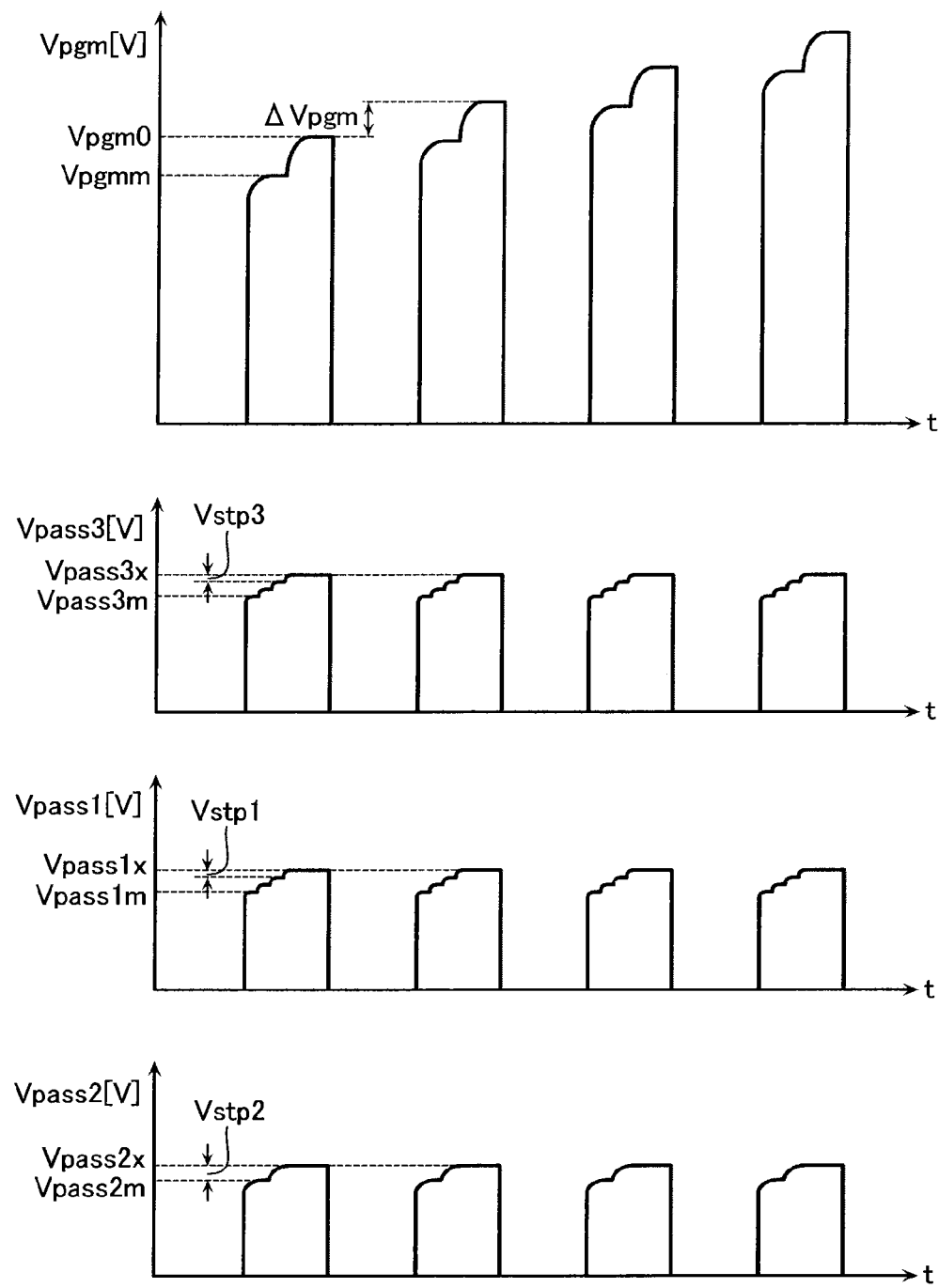
FIG. 7 is a waveform chart showing the write operation in the first embodiment.
Figure 8:
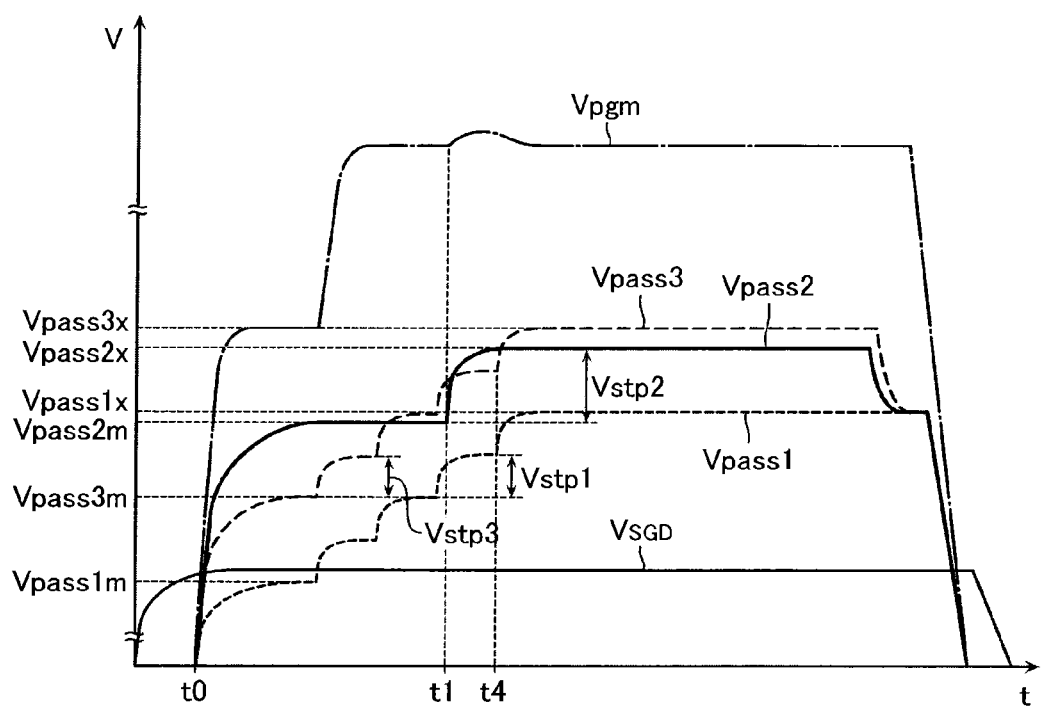
FIG. 8 is a waveform chart showing the write operation in the first embodiment.
Figure 8:
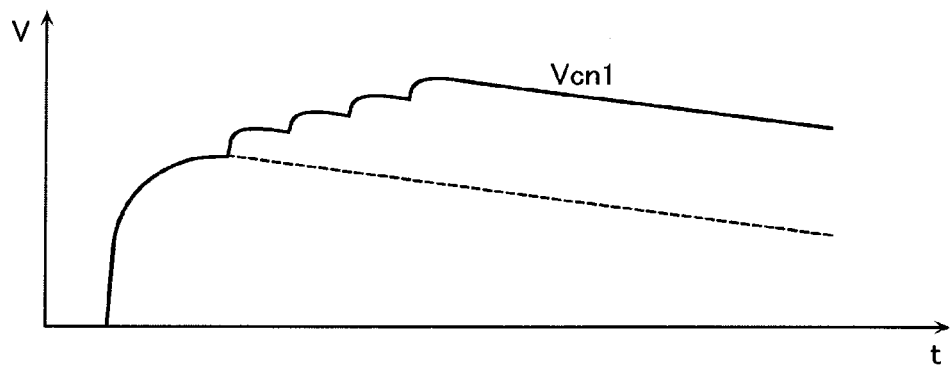

Next, a method of applying the program voltage Vpgm and the write pass voltages Vpass1-Vpass3 is described with reference to FIGS. 7 and 8. FIG. 7 shows a waveform chart when multiple times of the write operation (in FIG. 7, four times) are performed. In addition, FIG. 8 shows a waveform chart of each of the voltages in one time of the write operation.

As shown in FIG. 7, the program voltage Vpgm is applied as a pulse shaped voltage. Although not shown in the drawings, after one time of application of the pulse shaped program voltage Vpgm, a well-known verify read operation (a read operation for verifying whether write of desired data in a selected memory cell has been completed or not) is performed. In the case it is detected by the verify read operation that write has not been completed, the program voltage Vpgm is increased from an initial value Vpgm0 by an amount of a step-up width ΔVpgm (step-up operation), and the write operation is performed again (that is, a pulse shaped program voltage Vpgm of maximum value Vpgm0+ΔVpgm is applied). Such a write verify operation, step-up operation, and write operation are repeated until the write operation is completed.

Every one time of application of the program voltage Vpgm (every one time of the write operation), the write pass voltages Vpass1-Vpass3 are applied to the first non-selected memory cells Mns1 and the second non-selected memory cells Mns2. As shown in FIG. 7, the write pass voltages Vpass1 and Vpass3 applied to the control gates of the second non-selected memory cells Mns2 do not reach target values Vpass1x and Vpass1x in one go, but, after being once raised to intermediate values Vpass1m an Vpass3m, have their voltages raised to the target values Vpass1 and Vpass3 in a stepped manner over a number of times (in FIGS. 7 and 8, three times). Voltage rise widths in one time of a voltage raising operation are Vstp1 and Vstp3, respectively.

The reason for raising the write pass voltages Vpass1 and Vpass3 to the target values in a stepped manner by multiple times of the voltage raising operations in this way is as follows. As indicated by a dashed line in a lower graph of FIG. 8, when the write pass voltages Vpass1 and Vpass3 are raised, a channel potential Vcn1 in a write inhibit NAND cell unit NU rises due to capacitive coupling, but this channel potential Vcn1 falls gradually due to junction leak and so on. When a degree of fall is large, there is a risk of a mistaken write occurring in the write inhibit NAND cell unit.

As mentioned above, raising the write pass voltages Vpass1 and Vpass3 to the target values in a stepped manner by multiple times of the voltage raising operations allows this kind of fall in the channel potential Vcn1 to be suppressed. That is, in each of the multiple times of the voltage raising operations, capacitive coupling of the channel is caused to occur, whereby the channel potential Vcn1 can be raised.

On the other hand, a method of voltage application of the write pass voltage Vpass2 applied to the control gates of the first non-selected memory cells Mns1 differs from that described above. That is, as shown in FIG. 7, the write pass voltage Vpass2 is once raised to an intermediate value Vpass2m. Then, the write pass voltage Vpass2 is raised to the target value Vpass2x in a stepped manner by another voltage raising operation. In the example shown in FIGS. 7 and 8, after being raised to the intermediate value Vpass2m, the write pass voltage Vpass2 is then further raised to the target value Vpass2x by one time of the voltage raising operation. A voltage rise width in the one time of the voltage raising operation is Vstp2. Thus, the voltage rise width Vstp2 of the write pass voltage Vpass2 is larger than the voltage rise widths Vstp1 and Vstp3. Preferably, the voltage rise width Vstp2 is not less than twice the voltage rise widths Vstp1 and Vstp3. In addition, the number of times of the voltage raising operations of the write pass voltage Vpass2 is less than the number of times of the voltage raising operations of the write pass voltage Vpass1 or Vpass3 (In FIG. 8, the former is one time and the latter is three times).

The reason that the number of times of voltage raisings of the write pass voltage Vpass2 is set fewer than the number of times of voltage raisings of the write pass voltages Vpass1 and Vpass3, and instead the voltage rise width Vstp2 of the write pass voltage Vpass2 is set larger than the voltage rise widths Vstp1 and Vstp3 of the write pass voltages Vpass1 and Vpass3 in this way is as follows.

The write pass voltage Vpass2 is applied to at least the first non-selected memory cells Mns1 adjacent to the selected memory cell Ms. As a result, it is easy for application of the write pass voltage Vpass2 to cause capacitive coupling with the selected memory cell Ms to occur.

If the write pass voltage Vpass2 has its voltage raised at a certain timing (for example, at time t1 in FIG. 8), capacitive coupling in the selected word line WLs is caused to occur at that time, thereby enabling a voltage value of the program voltage Vpgm to be effectively raised. Setting the voltage rise width Vstp2 at this time large enables a voltage rise width of the program voltage Vpgm also to be increased. As a result, a voltage to be generated by a boost circuit of the program voltage Vpgm need not be raised, hence power consumption can be reduced.

Note that time t1 when the write pass voltage Vpass2 is raised (refer to FIG. 8) may be the same as or different from a timing of voltage raising of the write pass voltages Vpass1 or Vpass3. As an example, time t1 when the write pass voltage Vpass2 has its voltage raised is preferably in a latter half of a time period when the voltage raising operations of the write pass voltages Vpass1 and Vpass3 are being performed. Typically, time t1 is preferably a time which is later than a time midway between time t0 when the program voltage Vpgm begins its rise from 0 V toward an intermediate value Vpgmm and time t4 which is a last time that the write pass voltages Vpass1 or Vpass3 have their voltages raised in a stepped manner (that is, a value of t1 is preferably larger than (t4−t0)/2).

Figure 9:
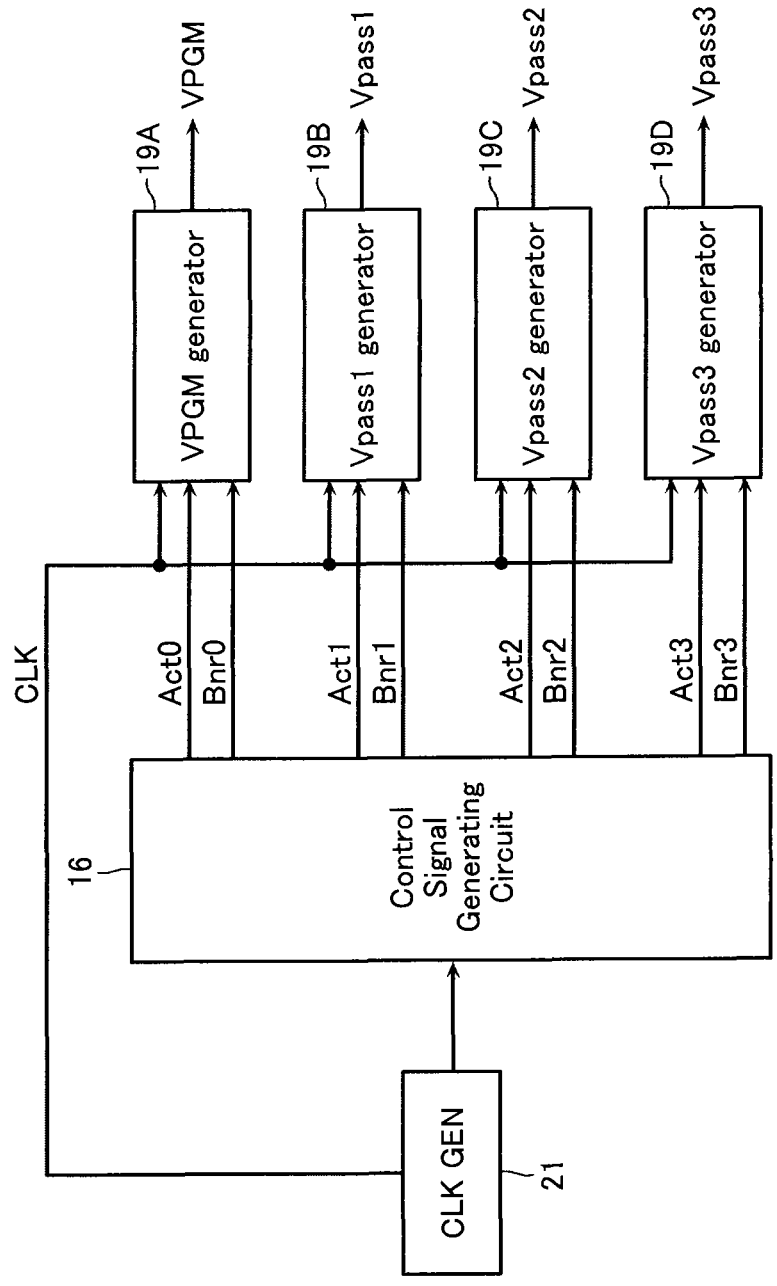
FIG. 9 shows an example of a circuit configuration for realizing operations in the first embodiment.

A circuit configuration for generating the program voltage Vpgm and the write pass voltages Vpass1-Vpass3 such as shown in FIGS. 7 and 8 is described with reference to FIG. 9. FIG. 9 representatively illustrates the configuration for generating the program voltage Vpgm and the write pass voltages Vpass1-Vpass3. The device of the present embodiment includes not only the configuration shown in FIG. 9, but also includes also configurations for generating voltages applied to the selected memory cell and the non-selected memory cells during a read operation, for example, although these configurations are not shown in FIG. 9.

The nonvolatile semiconductor memory device of the present embodiment comprises a program voltage generating circuit 19A and write pass voltage generating circuits 19B-19D as part of the internal voltage generating circuit 19 shown in FIG. 1. The program voltage generating circuit 19A is a circuit for generating the program voltage Vpgm. In addition, the write pass voltage generating circuits 19B-19D are circuits for generating, respectively, the write pass voltages Vpass1-Vpass3. The program voltage generating circuit 19A and the write pass voltage generating circuits 19B-19D may, for example, be configured comprising a well-known D/A converter, a charge pump circuit, and a limiter for setting a maximum value of a generated voltage of the charge pump circuit (not shown).

The program voltage generating circuit 19A and the write pass voltage generating circuits 19B-19D are supplied with, respectively, activating signals Act0-Act3 and voltage raising instruction signals Bnr0-Bnr3, from the control signal generating circuit 16. The activating signals Act0-Act3 function as activating signals for starting operation of a charge pump circuit in the respective voltage generating circuits 19A-19D when set to "H".

In addition, the voltage raising instruction signals Bnr0-Bnr3 are signals that, by being set to "H", instruct raising a value of an upper limit value set in a limiter circuit (not shown) in the voltage generating circuits 19A-19D. That is, when the voltage raising instruction signals Bnr0-Bnr3 become "H" immediately after the activating signals Act0-Act3 have switched to "H", the upper limit value of the limiter circuits switches from the ground potential Vss to the intermediate values Vpgm, Vpass1$m$, Vpass2$m$, and Vpass3$m$. Then, every time the voltage raising instruction signals Bnr0-Bnr3 newly rise to "H", the upper limit value of the limiter circuits is raised by an amount of the previously mentioned voltage rise widths. This enables the waveforms as shown in FIGS. 7 and 8 to be obtained.

Next, advantages of the first embodiment are described. In this first embodiment, the write pass voltages Vpass1 and Vpass3 have their voltages raised in a stepped manner by multiple times of the voltage raising operations. This makes it possible to suppress lowering of channel potential and prevent occurrence of mistaken write. Moreover, the write pass voltage Vpass2 has its voltage raised similarly in a stepped manner by multiple times of the voltage raising operations (including raising to the intermediate value). This makes it possible to promote voltage raising by capacitive coupling of the program voltage Vpgm, whereby a reduction in power consumption can be achieved.

Second Embodiment

Figure 10:
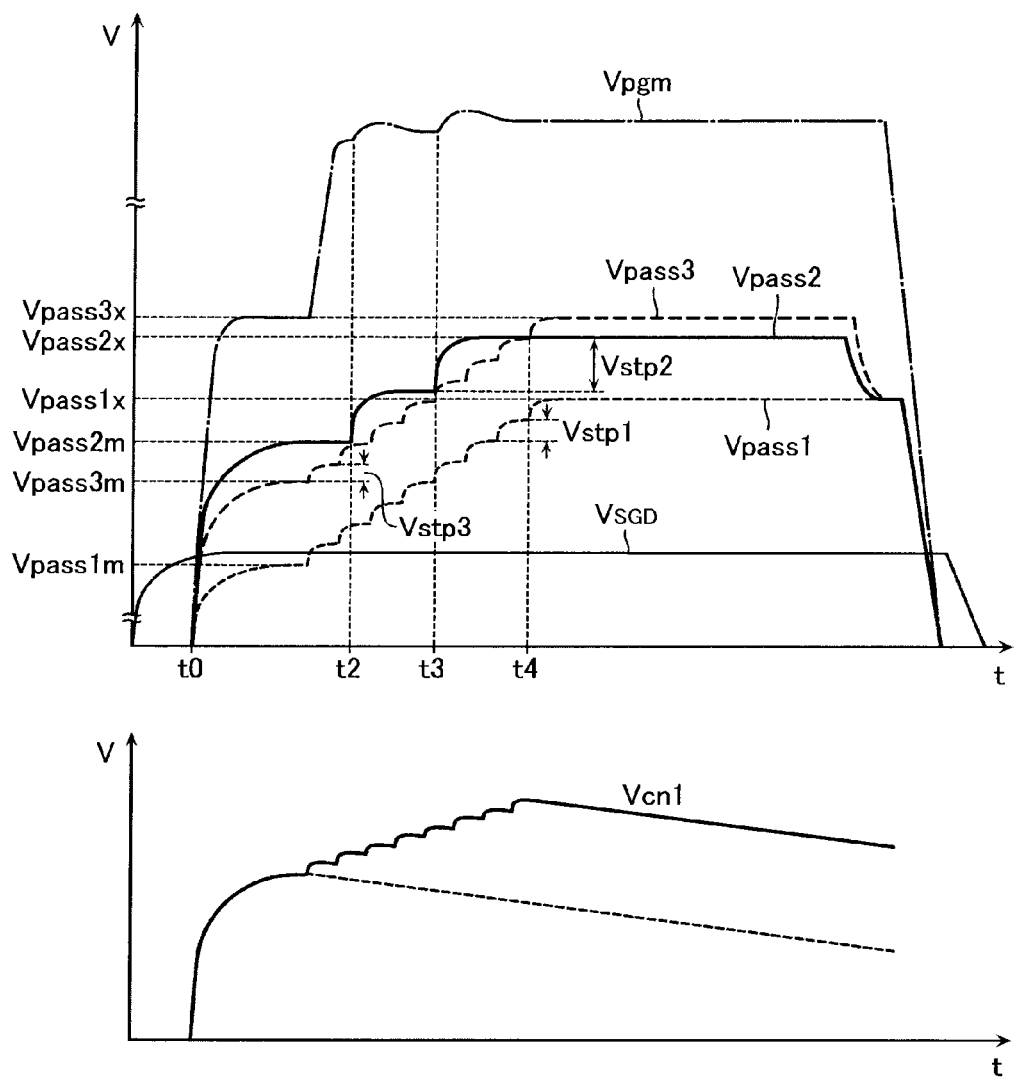
FIG. 10 is a waveform chart showing a write operation in a second embodiment.

Next, a nonvolatile semiconductor memory device according to a second embodiment is described with reference to FIG. 10. A configuration of the device is similar to that of the first embodiment. However, in this second embodiment, operation during the write operation differs from that in the first embodiment.

In this embodiment, the number of times of voltage raising operations of the write pass voltages Vpass1-Vpass3 and the voltage rise widths Vstp1-Vstp3 are different from those in the first embodiment. For the write pass voltages Vpass1 and Vpass3, the number of times of voltage raising operations (voltage rise widths Vstp1 and Vstp3) after raising to the intermediate values Vpass1$m$ and Vpass3$m$ is set to eight times. On the other hand, for the write pass voltage Vpass2, the number of times of voltage raising operations (voltage rise width Vstp2) after raising to the intermediate value Vpass2$m$ is set to two times. In this case too, similar advantages to those in the first embodiment can be displayed. Note that time t3 when the write pass voltage Vpass2 last undergoes the voltage raising operation is preferably a time which is later than a time midway between time t0 when the program voltage Vpgm begins its rise from 0V toward the intermediate value Vpgm$m$ and time t4 which is a last time that the write pass voltages Vpass1 or Vpass3 have their voltages raised in a stepped manner.

Third Embodiment

Figure 11:
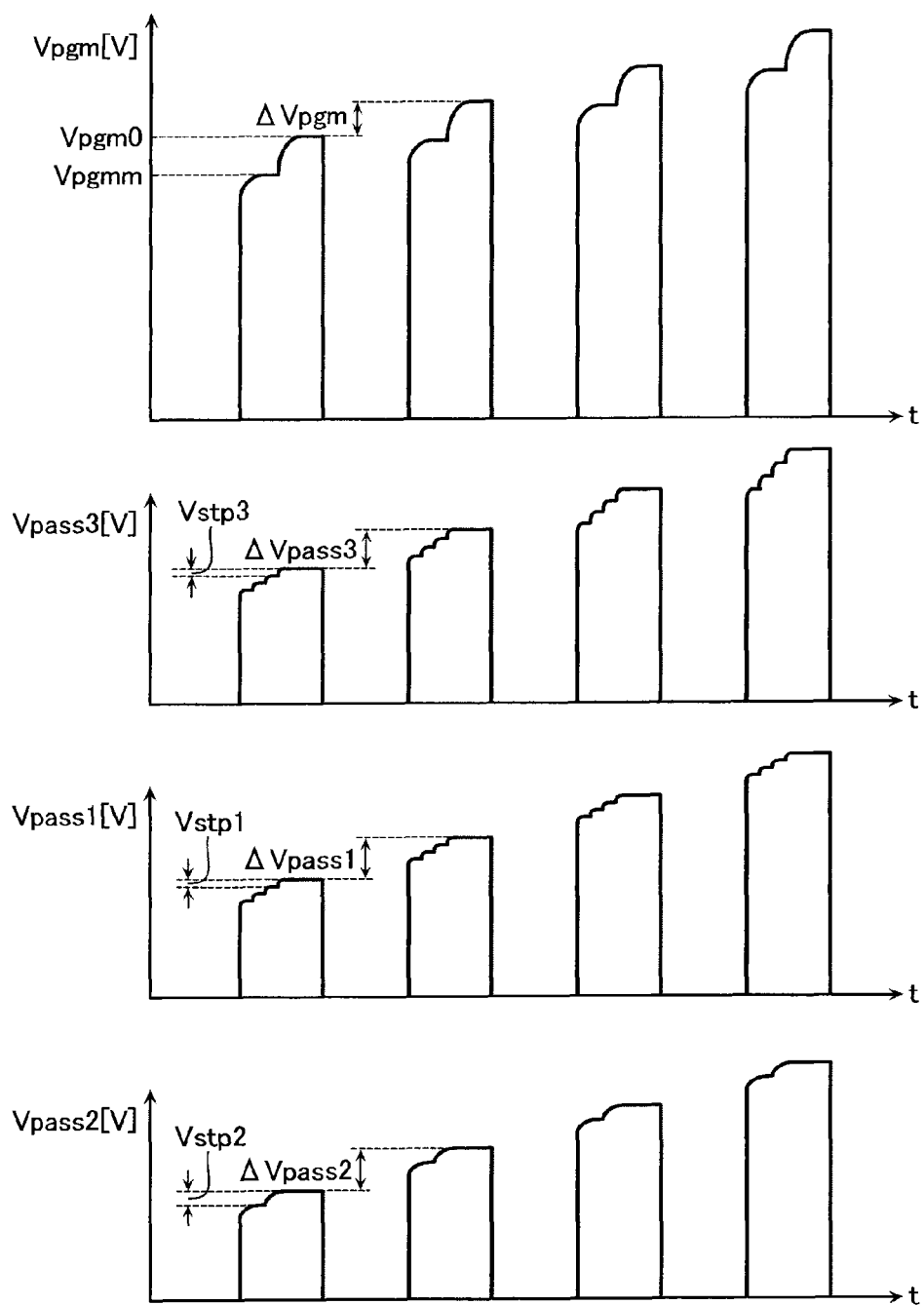
FIG. 11 is a waveform chart showing a write operation in a third embodiment.

Next, a nonvolatile semiconductor memory device according to a third embodiment is described with reference to FIG. 11. A configuration of the device is similar to that of the first embodiment. However, in this embodiment, operation during the write operation differs from that in the first embodiment.

This embodiment differs from the first embodiment in adopting a configuration where the step-up operation is executed not only on the program voltage Vpgm but also on the write pass voltages Vpass1-Vpass3. This configuration too allows similar advantages to those in the first embodiment to be displayed.

Fourth Embodiment

Figure 12:
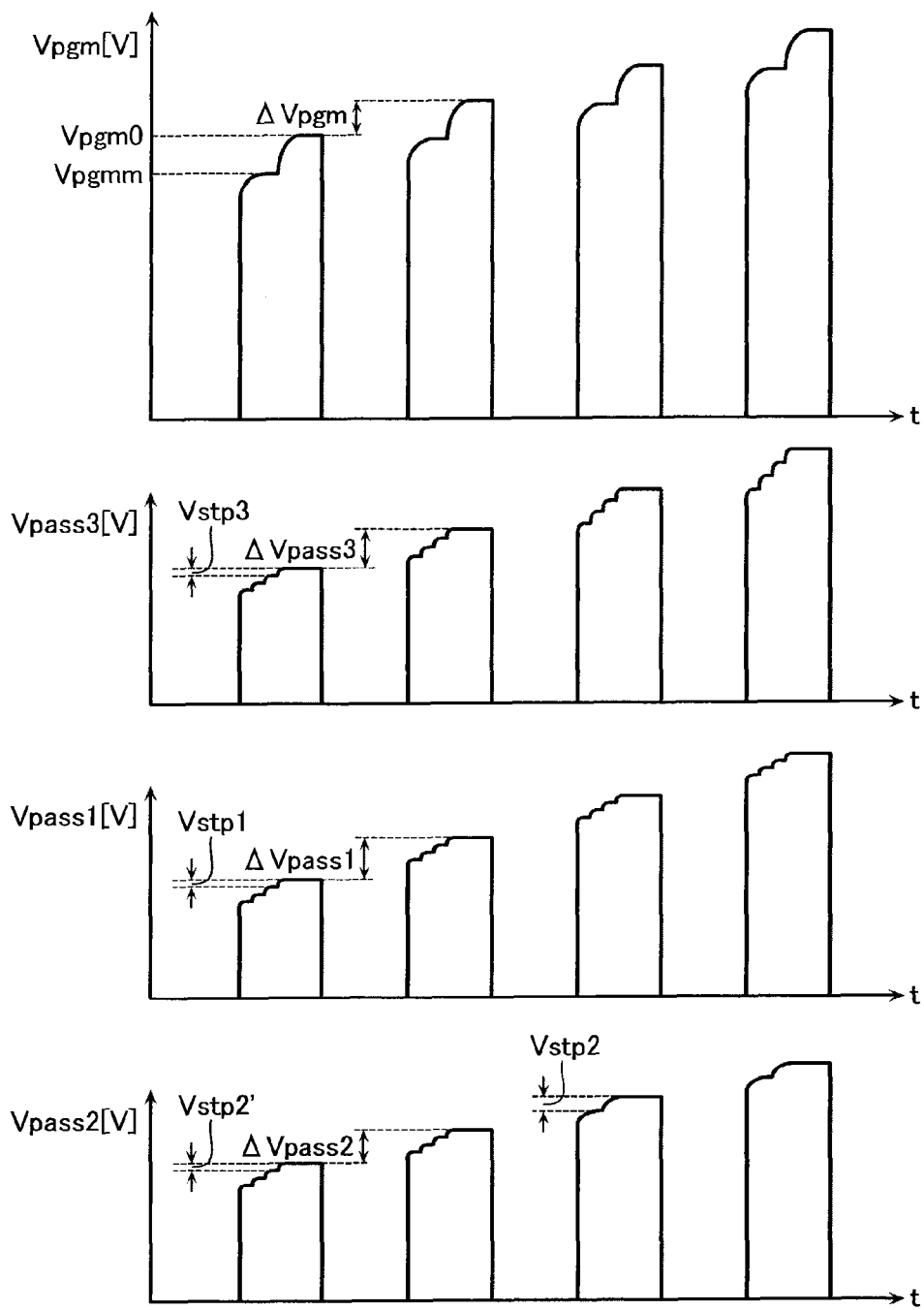
FIG. 12 is a waveform chart showing a write operation in a fourth embodiment.

Next, a nonvolatile semiconductor memory device according to a fourth embodiment is described with reference to FIG. 12. A configuration of the device is similar to that of the first embodiment. However, in this embodiment, operation during the write operation differs from that in the first embodiment.

In this embodiment, the voltage raising operation of the write pass voltage Vpass2 differs from that of the first embodiment. That is, as shown in FIG. 12, when a number of times of executions of the write operation is a certain number of times or less (two times in FIG. 12), the number of times of voltage raising operations of the write pass voltage Vpass2 and a voltage rise width Vstp2' are set substantially identical to those of the write pass voltages Vpass1 and Vpass3. On the other hand, when the number of times of executions of the write operation exceeds the certain number of times, the present embodiment is similar to the first embodiment. In other words, in this embodiment, the voltage rise width of the write pass voltage Vpass2 is changed according to whether the number of times of executions of the write operation is a certain number of times or less or not.

Changing the voltage rise width of the write pass voltage Vpass2 in accordance with increase in the number of times of executions (number of repetition times) of the write operation (or in accordance with the program voltage increasing) in the above-described manner allows the following advantages to be obtained.

When the number of times of executions of the write operation is few, the target value of the program voltage Vpgm is also set to a small value. As a result, a requirement for the voltage of the program voltage Vpgm to be raised by capacitive coupling is not very great.

On the other hand, when the number of times of executions of the write operation exceeds the certain number of times and the value of the program voltage Vpgm has risen to Vpgm+ n·ΔVpgm, there is an increased necessity for the voltage of the program voltage Vpgm to be raised by capacitive coupling. As a result, in the present embodiment, operations similar to those in previously described embodiments are executed only when the number of times of executions of the write operation exceeds the certain number of times. When the number of times of executions of the write operation is the certain number of times or less, the write pass voltage Vpass2 may also contribute to suppression of lowering of channel potential, hence a risk of occurrence of mistaken write becomes even less.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 13:
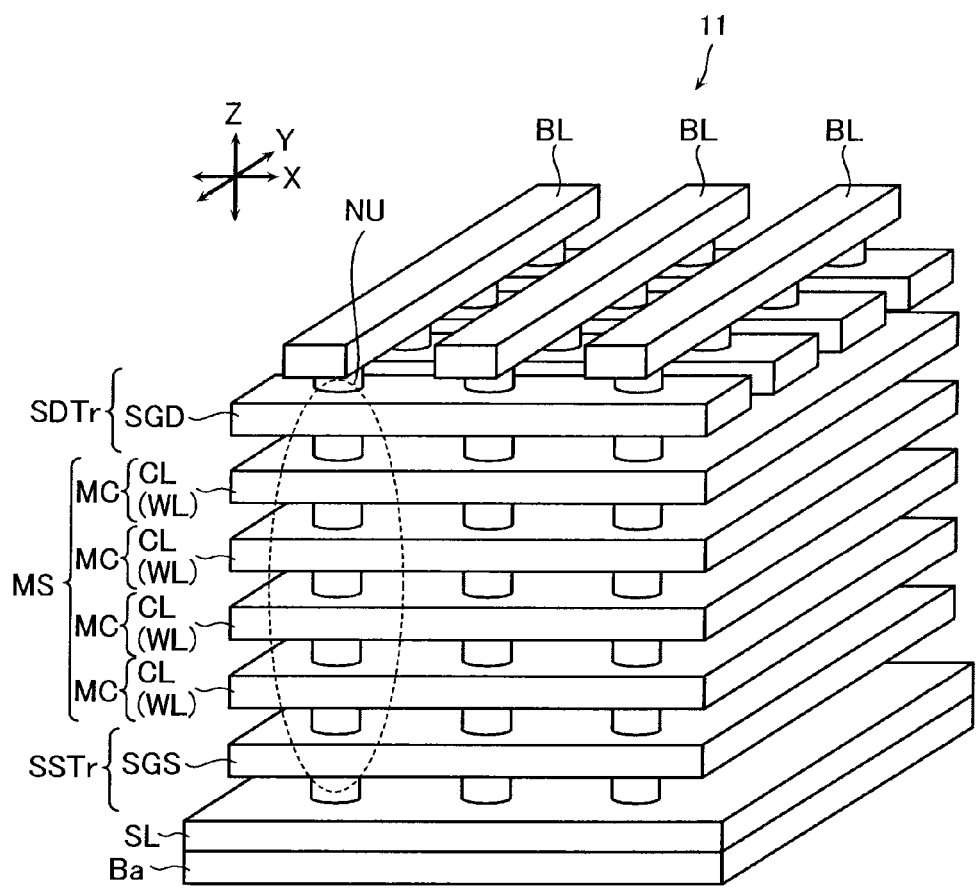
FIG. 13 shows a modified example.

For example, in the above-described embodiments, the memory cell array 11 is described as having a two-dimensional structure. However, the memory cell array 11 is not limited to this structure and may also have a three-dimensional structure. For example, as shown in FIG. 13, a memory cell array 11 having a three-dimensional structure includes a semiconductor layer SC and a conductive layer CL. The semiconductor layer SC extends in a vertical direction with respect to a semiconductor substrate Ba (Z direction) and functions as a body of a memory cell MC. The conductive layer CL surrounds a side surface of the semiconductor layer SC via a charge storage layer. The conductive layer CL functions as a gate of a memory cell MC and as a word line WL.

What is claimed is:

1. A nonvolatile semiconductor memory device, comprising:
   a memory cell array having memory strings arranged therein, each of the memory strings including a plurality of memory cells connected in series;
   a plurality of word lines connected to control gates of the memory cells; and
   a control circuit operative to control data write to the memory cells,
   when executing a write operation to the memory cells, the control circuit being operative to apply a program voltage to a selected word line connected to a selected memory cell,
   apply a first write pass voltage smaller than the program voltage to a first non-selected word line including a word line adjacent to the selected word line, and
   apply a second write pass voltage smaller than the program voltage to a second non-selected word line which is a non-selected word line excluding the first non-selected word line, and
   the control circuit being configured to, in the write operation, raise the first write pass voltage toward a first target value by executing a voltage raising operation having a first voltage rise width, X times, and
   raise the second write pass voltage toward a second target value by executing a voltage raising operation having a second voltage rise width, Y times,
   the first voltage rise width being larger than the second voltage rise width, and
   X times being fewer than Y times.

2. The nonvolatile semiconductor memory device according to claim 1, wherein
   the first voltage rise width is not less than twice the second voltage rise width.

3. The nonvolatile semiconductor memory device according to claim 2, wherein
   a time when the voltage raising operation having the first voltage rise width for the first write pass voltage is performed is in a latter half of a period when the voltage raising operation for the second write pass voltage is performed.

4. The nonvolatile semiconductor memory device according to claim 1, wherein
   the control circuit increases the first voltage rise width in accordance with increase in number of repetition times of the write operation.

5. The nonvolatile semiconductor memory device according to claim 4, wherein
   the first voltage rise width is not less than twice the second voltage rise width.

6. The nonvolatile semiconductor memory device according to claim 5, wherein
   a time when the voltage raising operation having the first voltage rise width for the first write pass voltage is performed is in a latter half of a period when the voltage raising operation for the second write pass voltage is performed.

7. The nonvolatile semiconductor memory device according to claim 1, wherein
   the second non-selected memory cell includes:
   one or a plurality of third non-selected memory cells adjacent to the first non-selected memory cell; and
   a fourth non-selected memory cell excluding the third non-selected memory cell,
   the second write pass voltage applied to the third non-selected memory cell rises to a first voltage value during the write operation, and
   the second write pass voltage applied to the fourth non-selected memory cell rises to a second voltage value smaller than the first voltage value during the write operation.

8. The nonvolatile semiconductor memory device according to claim 7, wherein
   the first voltage value is larger than the first target value of the first write pass voltage, and
   the second voltage value is smaller than the first target value of the first write pass voltage.

9. The nonvolatile semiconductor memory device according to claim 7, wherein
   the first voltage rise width is not less than twice the second voltage rise width.

10. The nonvolatile semiconductor memory device according to claim 9, wherein
    a time when the voltage raising operation having the first voltage rise width for the first write pass voltage is performed is in a latter half of a period when the voltage raising operation for the second write pass voltage is performed.

11. The nonvolatile semiconductor memory device according to claim 1, wherein
when the number of times of the write operation is a certain number of times or less, the control circuit performs the voltage raising operation of the first write pass voltage by a third voltage rise width smaller than the first voltage rise width, and
when the number of times of the write operation exceeds the certain number of times, the control circuit performs the voltage raising operation of the first write pass voltage by the first voltage rise width.

12. The nonvolatile semiconductor memory device according to claim 11, wherein
the first voltage rise width is not less than twice the second voltage rise width.

13. The nonvolatile semiconductor memory device according to claim 12, wherein
a time when the voltage raising operation having the first voltage rise width for the first write pass voltage is performed is in a latter half of a period when the voltage raising operation for the second write pass voltage is performed.

14. A nonvolatile semiconductor memory device, comprising:
a memory cell array having memory strings arranged therein, each of the memory strings including a plurality of memory cells connected in series;
a plurality of word lines connected to control gates of the memory cells; and
a control circuit operative to control data write to the memory cells,
when executing a write operation to the memory cells, the control circuit being operative to apply a program voltage to a selected word line connected to a selected memory cell,
apply a first write pass voltage smaller than the program voltage to a first non-selected word line including a word line adjacent to the selected word line, and
apply a second write pass voltage smaller than the program voltage to a second non-selected word line which is a non-selected word line excluding the first non-selected word line, and
the control circuit being configured to, in the write operation, raise the first write pass voltage toward a first target value by executing a voltage raising operation having a first voltage rise width, and
raise the second write pass voltage toward a second target value by executing a voltage raising operation having a second voltage rise width,
the first voltage rise width being larger than the second voltage rise width.

15. The nonvolatile semiconductor memory device according to claim 14, wherein
the first voltage rise width is not less than twice the second voltage rise width.

16. The nonvolatile semiconductor memory device according to claim 15, wherein
a time when the voltage raising operation having the first voltage rise width for the first write pass voltage is performed is in a latter half of a period when the voltage raising operation for the second write pass voltage is performed.

17. The nonvolatile semiconductor memory device according to claim 14, wherein
the control circuit increases the first voltage rise width in accordance with increase in number of repetition times of the write operation.

18. The nonvolatile semiconductor memory device according to claim 14, wherein
the second non-selected memory cell includes:
one or a plurality of third non-selected memory cells adjacent to the first non-selected memory cell; and
a fourth non-selected memory cell excluding the third non-selected memory cell,
the second write pass voltage applied to the third non-selected memory cell rises to a first voltage value during the write operation, and
the second write pass voltage applied to the fourth non-selected memory cell rises to a second voltage value smaller than the first voltage value during the write operation.

19. The nonvolatile semiconductor memory device according to claim 18, wherein
the first voltage value is larger than the first target value of the first write pass voltage, and
the second voltage value is smaller than the first target value of the first write pass voltage.

20. The nonvolatile semiconductor memory device according to claim 14, wherein
when a number of times of the write operation is a certain number of times or less, the control circuit performs the voltage raising operation of the first write pass voltage by a third voltage rise width smaller than the first voltage rise width, and
when the number of times of the write operation exceeds the certain number of times, the control circuit performs the voltage raising operation of the first write pass voltage by the first voltage rise width.

* * * * *